(12) United States Patent
Barkyoumb et al.

(10) Patent No.: US 7,235,487 B2
(45) Date of Patent: Jun. 26, 2007

(54) METAL SEED LAYER DEPOSITION

(75) Inventors: Steven P Barkyoumb, Essex Junction, VT (US); Jonathan D. Chapple-Sokol, Essex Junction, VT (US); Edward C. Cooney, III, Jericho, VT (US); Keith E. Downes, Stowe, VT (US); Thomas L. McDevitt, Underhill, VT (US); William J. Murphy, North Ferrisburgh, VT (US)

(73) Assignee: International Business Machines Corporation, Armonk, NY (US)

( * ) Notice: Subject to any disclaimer, the term of this patent is extended or adjusted under 35 U.S.C. 154(b) by 28 days.

(21) Appl. No.: 10/709,562

(22) Filed: May 13, 2004

(65) Prior Publication Data

US 2005/0253265 A1    Nov. 17, 2005

(51) Int. Cl.
*H01L 21/44* (2006.01)

(52) U.S. Cl. .................. 438/687; 438/643
(58) Field of Classification Search .......... 438/643, 438/687, 678
See application file for complete search history.

(56) References Cited

U.S. PATENT DOCUMENTS

| | | | |
|---|---|---|---|
| 6,319,728 B1 * | 11/2001 | Bhan et al. .......... | 438/687 |
| 6,559,061 B2 | 5/2003 | Hashim et al. | |
| 6,562,219 B2 * | 5/2003 | Kobayashi et al. ......... | 205/186 |
| 6,579,730 B2 | 6/2003 | Li et al. | |
| 6,582,569 B1 | 6/2003 | Chiang et al. | |
| 2002/0092584 A1 * | 7/2002 | Soininen et al. ............ | 148/282 |
| 2002/0115287 A1 | 8/2002 | Hashim et al. | |
| 2004/0256351 A1 * | 12/2004 | Chung et al. .................. | 216/13 |
| 2005/0054202 A1 * | 3/2005 | Pan et al. .................... | 438/694 |

\* cited by examiner

*Primary Examiner*—Tuan H. Nguyen
(74) *Attorney, Agent, or Firm*—Schmeiser, Olsen & Watts; William D. Sabo

(57) ABSTRACT

A method and structure for reducing the corrosion of the copper seed layer during the fabrication process of a semiconductor structure. Before the structure (or the wafer containing the structure) exits the vacuum environment of the sputter tool, the structure is warmed up to a temperature above the water condensation temperature of the environment outside the sputter tool. As a result, water vapor would not condense on the structure when the structure exits the sputter tool, and therefore, corrosion of the seed layer by the water vapor is prevented. Alternatively, a protective layer resistant to water vapor can be formed on top of the seed layer before the structure exits the sputter tool environment. In yet another alternative embodiment, the seed layer can comprises a copper alloy (such as with aluminum) which grows a protective layer resistant to water vapor upon exposure to water vapor.

9 Claims, 2 Drawing Sheets

METAL SEED LAYER DEPOSITION

BACKGROUND OF INVENTION

1. Technical Field

The present invention relates to metal interconnect in semiconductor devices, and more particularly, to metal seed layer deposition.

2. Related Art

Copper (Cu) is usually used as an interconnect material in semiconductor devices. Usually, if a copper region is to be electrically coupled to a target region (e.g., a drain/source region of a semiconductor transistor), a diffusion barrier layer (which is electrically conducting) is first applied to the target region, and then the copper region is applied to the diffusion barrier layer. In other words, the copper region and the target region are physically separated by the diffusion barrier layer. As a result, the diffusion barrier layer prevents copper atoms of the copper region from diffusing into the target region. Usually, the copper region is applied to the diffusion barrier layer in two steps. The first step comprises applying a thin layer (called seed layer) of copper to the surface of the diffusion barrier layer. The second step comprises applying a bulk layer of copper to the seed layer so that both the seed layer and bulk layer merge to form the copper region. The quality of the seed layer greatly affects the quality of the copper region. For instance, if the seed layer adheres well to the diffusion barrier layer, so does the resulting copper region.

Therefore, there is a need for a novel structure of a good seed layer. Also, there is a need for a method of forming the good seed layer.

SUMMARY OF INVENTION

The present invention provides a method for forming a seed layer on a semiconductor structure, the method comprising the steps of (a) depositing the seed layer on the semiconductor structure, the seed layer comprising a metal; and (b) raising the temperature of the seed layer above a water condensation temperature, wherein the seed layer has not been subjected to water vapor prior to raising the temperature of the seed layer.

The present invention also provides a method for forming a seed layer on a semiconductor structure, the method comprising the steps of (a) depositing the seed layer on the semiconductor structure, the seed layer comprising a metal; and (b) forming on the seed layer a protective layer being inert to water vapor and capable of preventing the seed layer from chemically reacting with water vapor, wherein the seed layer has not been subjected to water vapor prior to the forming step.

The present invention also provides a method for forming a seed layer on a semiconductor structure, the method comprising the steps of (a) depositing the seed layer on the semiconductor structure, the seed layer comprising a metal; and (b) smoothing a top surface of the seed layer, wherein the seed layer has not been subjected to water vapor prior to the smoothing step.

The present invention also provides a semiconductor structure, comprising (a) a substrate; (b) a via hole in the substrate; (c) a diffusion barrier layer deposited on bottom and side walls of the via hole, the diffusion barrier being capable of preventing diffusion of the metal; and (d) a seed layer deposited on the diffusion barrier layer, the seed layer comprising a copper alloy such that corrosion of the seed layer is prevented in response to the seed layer being subjected to water vapor at a temperature lower than a water condensation temperature.

The present invention provides the advantage of a good seed layer in fabricating semiconductor devices.

DETAILED DESCRIPTION

Figure 1A:
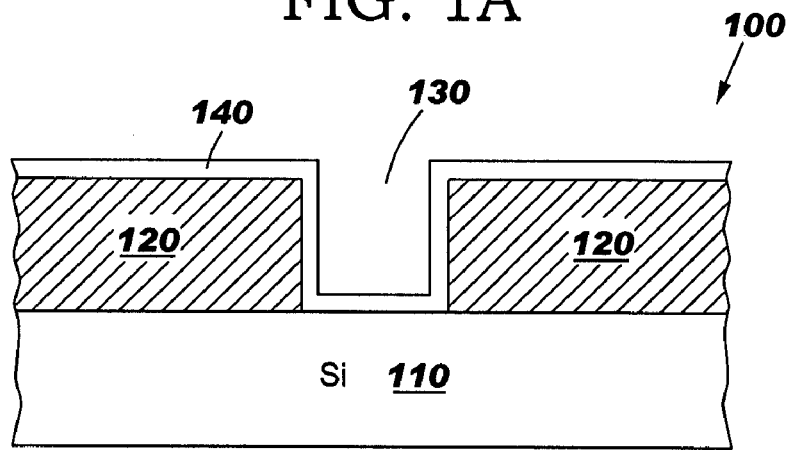
FIGS. 1A–1D illustrate cross-sectional views of a semiconductor structure after each of a series of fabrication steps is performed, in accordance with embodiments of the present invention.

FIGS. 1A–1D illustrate cross-sectional views of a semiconductor structure 100 after each of a series of fabrication steps is performed, in accordance with embodiments of the present invention. FIG. 1A illustrates the structure 100 after a dielectric layer 120, a via hole 130, and then a diffusion barrier layer 140 are formed on a semiconductor (e.g., silicon (Si) or SOI—silicon on insulation) substrate 110. More specifically, in one embodiment, the dielectric layer 120 can be formed on the top surface the Si substrate 110 by, illustratively, thermal oxidation (i.e., heating the top surface of the Si substrate 110 so as to make silicon material at the top surface of the Si substrate 110 to react with oxygen to form silicon dioxide, a dielectric material). Then, the via hole 130 is etched in the dielectric layer 120 using, illustratively, chemical etching. Finally, the diffusion barrier layer 140 can be deposited on the entire structure 100. The diffusion barrier layer 140 may comprise a nitride (e.g., silicon nitride), or silicon carbide, etc. The diffusion barrier layer 140 covers the bottom and side walls of the via hole 130 and the top surface of the dielectric layer 120. A top surface of a region is a surface where fabrication steps are directed. In one embodiment, the via hole 130 after being filled with an electrically conducting material can be used to electrically connect a source/drain region (not shown) in the Si substrate 110 to an interconnect level (not shown) above the dielectric layer 120.

Figure 1B:
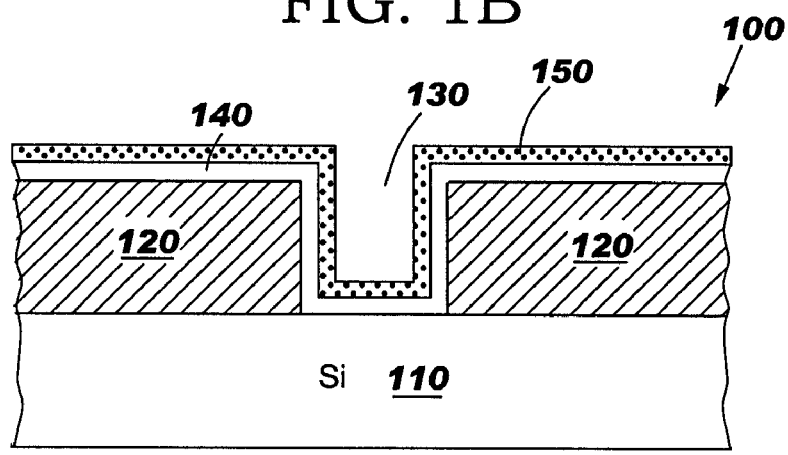

FIG. 1B illustrates the structure 100 after a copper seed layer 150 is formed on top of the structure 100 of FIG. 1A, in accordance with embodiments of the present invention. In one embodiment, the copper seed layer 150 can be deposited on the entire structure 100 of FIG. 1A using, illustratively, a PVD (physical vapor deposition) process, which is also called a sputter deposition process. As a result, the copper seed layer 150 covers the bottom and side walls of the via hole and the top surface of the diffusion barrier layer 140.

Figure 1C:
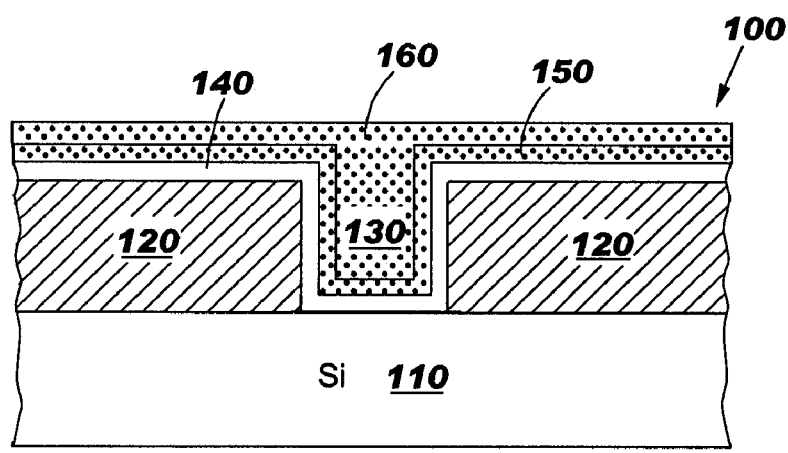

FIG. 1C illustrates the structure 100 after a copper bulk layer 160 is formed on top of the entire structure 100 of FIG. 1B, in accordance with embodiments of the present invention. In one embodiment, the copper bulk layer 160 can be deposited on the structure 100 of FIG. 1B such that the Cu seed layer 150 and the Cu bulk layer 160 merge to form a copper region 150,160. In one embodiment, the Cu bulk layer 160 is deposited using an electroplated mode. Alternatively, CVD (chemical vapor deposition) processing in conjunction with PVD can also be used to fill the structures. In the electroplated mode, the Cu seed layer 150 is used as an electrode. In one embodiment, the Cu seed layer 150 can be deposited using either PVD means or CVD or ALD (Atomic Layer Deposition) means and still be used as an electrode to support electroplating, also called electrofilling. Therefore, the quality of the Cu seed layer 150 greatly affects the quality of the combined copper region 150,160.

For instance, if the seed layer 150 adheres well to the diffusion barrier layer 140, so does the resulting copper region 150,160.

In one embodiment, the sputter deposition process of forming the Cu seed layer 150 on the structure 100 of FIG. 1A is performed inside a sputter tool (not shown) in the condition of very low pressures (from 0.1 millitorr to 50 millitorr during sputter deposition and then lower to 1 E-7 torr to 1 E-10 torr between depositions; these low pressure ranges are considered vacuum) and with the structure 100 of FIG. 1A being at very low temperatures (around 80° C. to 15° C.). The vacuum condition ensures that no contaminants are present in the space around the structure 100 of FIG. 1A that could deposit on or react with the components of the structure 100. The low temperature of the structure 100 ensures that the formed Cu seed layer 150 is continuous. If the sputter deposition process is performed on the structure 100 being at high temperatures (e.g., around 100° C. or greater), the formed Cu seed layer 150 may be discontinuous and therefore may inhibit the subsequent copper electrofilling of the via hole 130.

In one embodiment, after the Cu seed layer 150 is formed on the structure 100 of FIG. 1A by the sputter deposition process inside the sputter tool, the structure 100 is brought out of the vacuum environment of the sputter tool and into a factory environment in which water vapor is usually present. Before the structure 100 exits the vacuum environment of the sputter tool, the temperature of the structure 100 is raised (i.e., warmed up) above the water condensation temperature of the factory environment. As a result, when the structure 100 enters the factory environment, water vapor in the factory environment does not condense on the structure 100. Without this warming-up step, water vapor in the factory environment would condense on the structure 100 and react with some copper material of the Cu seed layer 150 to form copper oxide (CuO). In the subsequent electrofilling process (to form the Cu bulk layer 160 of FIG. 1C), this CuO is consumed and therefore the Cu seed layer 150 becomes thinner and may become discontinuous. This may inhibit the electrofilling process itself.

In one embodiment, the temperature of the structure 100 can be raised by flowing a gas over (i.e., into direct physical contact with) the surface of the structure 100 of FIG. 1B in a chamber (not shown) of the sputter tool. In one embodiment, the gas is inert to the materials of the structure 100 of FIG. 1B (i.e., inert to copper, silicon, etc.) and is at a temperature higher than the water condensation temperature. For instance, the gas can comprise nitrogen at 10° C. or higher. In one embodiment, this gas flowing step can be performed in a "cool station" which is usually present in a commercial sputter tool. The cool station is typically used for cooling a wafer by flowing a gas over it. The same cool station can be used to warm up the structure 100 of FIG. 1B in this present invention.

In one embodiment, the temperature of the structure 100 of FIG. 1B can be raised above the water condensation temperature of the factory environment by placing the structure 100 of FIG. 1B on a chuck inside the vacuum environment of the sputter tool. The chuck should be at a temperature higher than the water condensation temperature so as to raise the temperature of the Cu seed layer 150 above the water condensation temperature.

In one embodiment, before the structure 100 of FIG. 1B exits the vacuum environment of the sputter tool, the structure 100 of FIG. 1B can be treated with a gas plasma (such as oxygen plasma) or a neutral gas species (e.g., nitrous oxide plasmas ($N_2O$), Nitrogen plasmas, etc.) so as to grow or create a protective layer (not shown) on the top surface of the Cu seed layer 150. As a result, when the structure 100 enters the factory environment, water vapor in the factory environment condensing on the structure 100 (if any) would not react with copper material of the Cu seed layer 150. In other words, the Cu seed layer 150 remains intact and the subsequent electrofilling step will not be detrimentally affected. In one embodiment, the gas plasma can be oxygen plasma. The forming of the protective layer can be performed during (i.e., in situ) or after the forming of the Cu seed layer 150.

In an alternative embodiment, before the structure 100 of FIG. 1B exits the vacuum environment of the sputter tool, the structure 100 of FIG. 1B can be treated with a chemical that reacts with copper material of the Cu seed layer 150 to form a protective layer (not shown) on the top surface of the Cu seed layer 150. For example, the structure 100 of FIG. 1B can be treated with phosphine ($PH_3$) that reacts to form phosphorus compounds protecting the Cu seed layer 150. As a result, when the structure 100 enters the factory environment, water vapor in the factory environment condensing on the structure 100 (if any) would not react with copper material of the Cu seed layer 150. In other words, the Cu seed layer 150 remains intact and the subsequent electrofilling step will not be detrimentally affected. In one embodiment, the chemical reaction mentioned above is an oxidation reaction, where copper material of the Cu seed layer 150 is oxidized to form the CuO protective layer. This CuO protective layer is formed in a controlled manner which does not detrimentally affect subsequent electrofilling step. Without this CuO protective layer, when the structure 100 of FIG. 1B exits the vacuum environment of the sputter tool, water vapor would freely (i.e., without control) react with Cu of Cu seed layer 150. This would create an inconsistent seed layer which would detrimentally affect subsequent electrofilling step.

In an alternative embodiment, before the structure 100 of FIG. 1B exits the vacuum environment of the sputter tool, the top surface of the Cu seed layer 150 of the structure 100 of FIG. 1B can be smoothed by, illustratively, ion bombardment. As a result of the top surface of the Cu seed layer 150 being smooth, when the structure 100 of FIG. 1B exits the vacuum environment of the sputter tool, it is more difficult for the water vapor of the factory environment to attack (i.e., oxidize) the Cu seed layer 150. In other words, the corrosion of the Cu seed layer 150 due to water vapor of the factory environment is reduced. This effect can be explained as follows. The seed layer 150 when formed is not perfectly consistently thick but rather has some variability. Smoothing out the variability can prevent thinner areas from becoming consumed by the oxide growth mechanisms and thus can prevent the seed layer 150 from becoming inconsistent. Finally, ion bombardment with species like nitrogen will create surface and near-surface layers of nitrides that will essentially become protective films against the corrosion or oxidation of the seed layer 150 by the water vapor. Other species that could be bombarded into the copper (implanted) of the Cu seed layer 150 include phosphorus, yttrium, nickel, chromium, and boron.

In one embodiment, the Cu seed layer 150 can comprise a copper alloy (as opposed to pure copper in the embodiments above) which is physically resistant to copper oxidation caused by water vapor. For instance, copper aluminum alloy may be used as the seed layer 150. Upon exposure to water vapor, copper aluminum alloy grows a protective layer (aluminum oxide) which prevents further oxidation of copper and/or aluminum materials. Other alloys would be copper-silver, copper-nickel, copper-chromium, or any other alloying agent that imparts corrosion or oxidation resistance to copper.

Figure 1D:
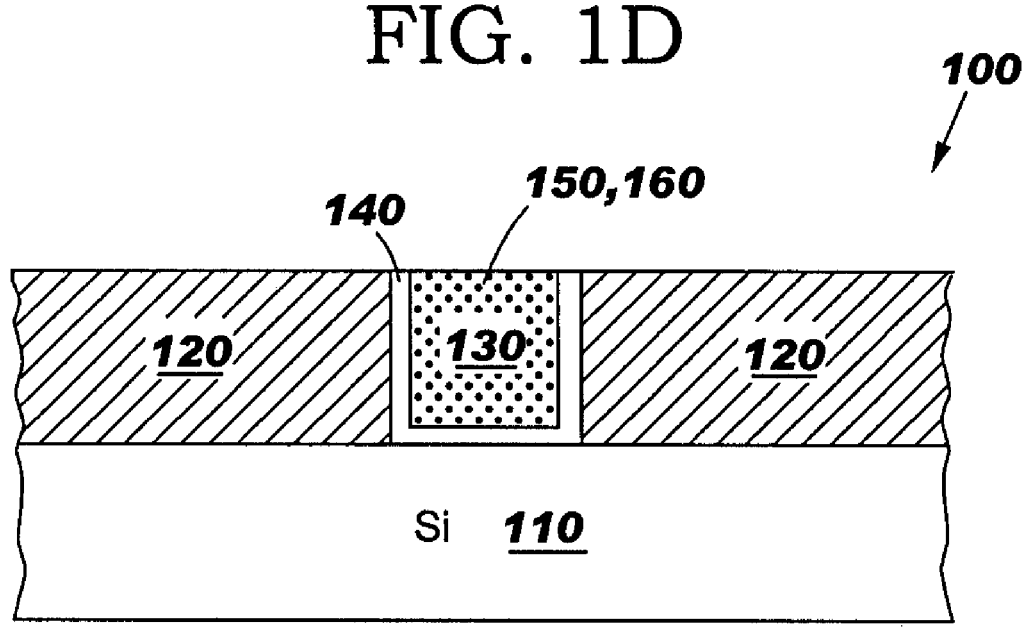

FIG. 1D illustrates the structure 100 after the top surface of the structure 100 of FIG. 1C is planarized, in accordance with embodiments of the present invention. In one embodiment, the planarization step is continued until the top surface of the dielectric layer 120 is exposed to the atmosphere. The planarization step can be performed using, illustratively, a CMP (chemical mechanical polishing) process. Reactive ion etching to etch-back the materials is another method of planarization. A third method is electromilling or electro-etching.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A method for forming a seed layer on a semiconductor structure, the method comprising the steps of:
   depositing the seed layer on the semiconductor structure in a tool, the seed layer comprising a metal;
   bringing the seed layer to a process temperature above a water condensation temperature of an ambient environment surrounding the tool while the semiconductor structure and the seed layer remain in the tool,
   wherein the seed layer has not been subjected to water vapor prior to said bringing the seed layer to the process temperature; and then
   transferring the semiconductor structure and the seed layer out of the tool resulting in the seed layer being exposed to the ambient environment surrounding the tool while a temperature of the seed layer is above the water condensation temperature.

2. The method of claim 1, further comprising the step of, after said transferring is performed, depositing a bulk layer directly on the seed layer, wherein the bulk layer comprises the metal.

3. The method of claim 1, wherein the metal comprises a material selected from the group consisting of copper and a copper alloy.

4. The method of claim 1, wherein the step of depositing the seed layer on the semiconductor structure comprises the steps of:
   depositing a diffusion barrier layer on the structure, the diffusion barrier being capable of preventing diffusion of the metal; and
   depositing the seed layer on the diffusion barrier layer.

5. The method of claim 1, wherein said bringing the seed layer to the process temperature comprises the step of flowing a gas into direct physical contact with the seed layer.

6. The method of claim 5, wherein the gas comprises a gas inert to materials of the structure.

7. The method of claim 5, wherein the step of flowing the gas into direct physical contact with the seed layer is performed in a chamber in the tool.

8. The method of claim 1, wherein said bringing the seed layer to the process temperature is performed in a cool station in the tool.

9. The method of claim 1, wherein said bringing the seed layer to the process temperature comprises the step of placing the structure including the seed layer on a chuck being at a temperature not below the process temperature.

* * * * *